US009743521B2

(12) United States Patent
Kurt et al.

(10) Patent No.: US 9,743,521 B2
(45) Date of Patent: Aug. 22, 2017

(54) LIGHT-SOURCE MODULE AND LIGHT-EMITTING DEVICE

(75) Inventors: Ralph Kurt, Eindhoven (NL); Cornelis Slob, Eindhoven (NL); Marc Andre De Samber, Eindhoven (NL); Michael Johan Ferdinand Marie Ter Laak, Eindhoven (NL); Gerard Kums, Eindhoven (NL); Egbert Lenderink, Eindhoven (NL); Marcellus Jacobus Johannes Van Der Lubbe, Eindhoven (NL); Mark Eduard Johan Sipkes, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 656 days.

(21) Appl. No.: 13/496,539

(22) PCT Filed: Sep. 10, 2010

(86) PCT No.: PCT/IB2010/054093
§ 371 (c)(1),
(2), (4) Date: Mar. 16, 2012

(87) PCT Pub. No.: WO2011/033433
PCT Pub. Date: Mar. 24, 2011

(65) Prior Publication Data
US 2012/0170265 A1 Jul. 5, 2012

(30) Foreign Application Priority Data

Sep. 17, 2009 (EP) .................................. 09170498

(51) Int. Cl.
F21V 9/00 (2015.01)
H05K 1/18 (2006.01)
(Continued)

(52) U.S. Cl.
CPC .............. *H05K 1/181* (2013.01); *F21S 2/005* (2013.01); *H05B 33/0824* (2013.01);
(Continued)

(58) Field of Classification Search
CPC ...... F21V 23/06; F21V 23/001; F21V 23/005; F21V 23/004; F21V 23/003; F21S 2/005;
(Continued)

(56) References Cited

U.S. PATENT DOCUMENTS 4,975,814 A * 12/1990 Schairer ............... B60Q 1/2696
257/E25.02
5,722,760 A 3/1998 Chien
(Continued)

FOREIGN PATENT DOCUMENTS

CN 1702521 A 11/2005
CN 1945822 A 4/2007
(Continued)

OTHER PUBLICATIONS

Marfeld Jan, Substrate for an LED submount and LED submount, Jun. 11, 2009, WO2009/071313A2, English translation.*
(Continued)

Primary Examiner — Jong-Suk (James) Lee
Assistant Examiner — James Endo
(74) Attorney, Agent, or Firm — Akarsh P. Belagodu

(57) ABSTRACT

A light-emitting module (3a-c; 23; 26; 33a-c) comprising a plurality of light-sources (12a-e; 27a-h) arranged in at least a first and a second column (18a-b; 28a-c) arranged side by side and extending along a first direction of extension ($X_1$) of the light-emitting module (3a-c; 23; 26; 33a-c); and a plurality of connector terminal pairs (13a-b, 14a-b, 15a-b, 16a-b 17a-b), each being electrically connected to a corresponding one of the light-sources (3a-c; 23; 26; 33a-c) for enabling supply of electrical power thereto. Each connector
(Continued)

terminal pair (13a-b, 14a-b, 15a-b, 16a-b 17a-b) comprises a first connector terminal (13a, 14a, 15a, 16a 17a) and a second connector terminal (13b, 14b, 15b, 16b 17b) being arranged at opposite sides of the light-emitting module (3a-c; 23; 26; 33a-c). The light-sources (12a-e; 27a-h) are arranged in a predetermined light-source sequence along the first direction of extension ($X_1$) of the light-emitting module (3a-c; 23; 26; 33a-c), and the connector terminal pairs (13a-b, 14a-b, 15a-b, 16a-b 17a-b) being electrically connected to the corresponding light-sources (12a-e; 27a-h) are arranged in the predetermined light-source sequence along the first direction of extension ($X_1$) of the light-emitting module.

20 Claims, 2 Drawing Sheets

(51) Int. Cl.
*F21S 2/00* (2016.01)
*H05B 33/08* (2006.01)
*F21V 23/06* (2006.01)
*G02F 1/1335* (2006.01)
*H01L 25/075* (2006.01)
*H05K 1/11* (2006.01)
*F21Y 115/10* (2016.01)
*F21Y 113/13* (2016.01)

(52) U.S. Cl.
CPC ........... *F21V 23/06* (2013.01); *F21Y 2113/13* (2016.08); *F21Y 2115/10* (2016.08); *G02F 1/133603* (2013.01); *G02F 2001/133612* (2013.01); *H01L 25/0753* (2013.01); *H01L 2224/48091* (2013.01); *H01L 2224/48227* (2013.01); *H05K 1/117* (2013.01); *H05K 2201/09709* (2013.01); *H05K 2201/10106* (2013.01); *H05K 2201/10969* (2013.01); *H05K 2203/049* (2013.01); *Y02P 70/611* (2015.11)

(58) Field of Classification Search
CPC .......... H05K 2201/09709; H05K 2201/10106; H05K 2201/10969; H05K 1/117; F21Y 2105/003; F21Y 2105/005; F21Y 2105/001; H01L 25/0753; H01L 23/49575; H01L 23/538; H01L 23/528; H01L 23/5386; H01L 25/00; H01L 25/167; H01L 27/156; H01L 27/153; H01L 27/15; H01L 2224/48091; H01L 2224/48227; H01L 25/0655; H01L 33/62; H01L 2224/48247; H01L 2224/4811; H01L 2224/48137; H01L 2224/48151; H01L 2224/4943; H01L 2224/49431; H01L 2933/0066; H05B 33/0824
USPC ................. 362/249.02, 249.06, 231, 311.02, 362/E23.169; 257/676, 88, 99, 773, 776
See application file for complete search history.

(56) References Cited

U.S. PATENT DOCUMENTS

| | | | |
|---|---|---|---|
| 5,827,186 A * | 10/1998 | Chen et al. | 600/407 |
| 6,200,002 B1 | 3/2001 | Marshall | |
| 7,144,131 B2 | 12/2006 | Rains | |
| 7,160,002 B2 | 1/2007 | Simon | |
| 7,350,937 B2 | 4/2008 | Yamamoto | |
| 7,431,477 B2 | 10/2008 | Chou | |
| 7,431,489 B2 | 10/2008 | Yeo | |
| 7,446,915 B2 | 11/2008 | Holmes | |
| 7,465,071 B2 | 12/2008 | Beukert | |
| 7,490,953 B2 | 2/2009 | Holten | |
| D597,971 S * | 8/2009 | Kobayakawa et al. | D13/180 |
| 7,569,861 B2 * | 8/2009 | Sakai | H01L 33/38 257/88 |
| 7,648,254 B2 * | 1/2010 | Yoo et al. | 362/249.01 |
| 7,655,957 B2 * | 2/2010 | Loh | H01L 25/0753 257/100 |
| 7,956,544 B2 * | 6/2011 | Kang et al. | 315/161 |
| 8,057,067 B2 * | 11/2011 | Ham et al. | 362/249.02 |
| 8,421,093 B2 * | 4/2013 | Okada et al. | 257/88 |
| 2001/0024368 A1 | 9/2001 | Henrici | |
| 2002/0080622 A1 | 6/2002 | Pashley et al. | |
| 2002/0113246 A1 * | 8/2002 | Nagai | F21K 9/90 257/99 |
| 2003/0193789 A1 | 10/2003 | Karlicek | |
| 2003/0235044 A1 * | 12/2003 | Amir | 361/767 |
| 2004/0129946 A1 * | 7/2004 | Nagai et al. | 257/98 |
| 2004/0173897 A1 | 9/2004 | Houle | |
| 2004/0208210 A1 * | 10/2004 | Inoguchi | 372/36 |
| 2005/0026505 A1 | 2/2005 | Washino | |
| 2005/0116667 A1 | 6/2005 | Mueller | |
| 2005/0265051 A1 | 12/2005 | Yamamoto | |
| 2006/0044215 A1 | 3/2006 | Brody | |
| 2006/0181878 A1 * | 8/2006 | Burkholder | 362/294 |
| 2007/0001177 A1 * | 1/2007 | Bruning et al. | 257/79 |
| 2007/0062032 A1 * | 3/2007 | Ter-Hovhannissian | 29/840 |
| 2007/0080438 A1 | 4/2007 | Yamanaka et al. | |
| 2007/0110386 A1 | 5/2007 | Chiang | |
| 2007/0115662 A1 * | 5/2007 | Roberts | G09G 3/3413 362/249.16 |
| 2007/0170452 A1 | 7/2007 | Kurokawa | |
| 2007/0206375 A1 | 9/2007 | Dowling et al. | |
| 2007/0217200 A1 | 9/2007 | Yang et al. | |
| 2007/0257335 A1 * | 11/2007 | O'Brien | H05K 1/053 257/618 |
| 2007/0262427 A1 | 11/2007 | Koide | |
| 2007/0290383 A1 * | 12/2007 | Bogner | B29D 11/00278 264/2.5 |
| 2008/0055534 A1 | 3/2008 | Kawano | |
| 2008/0083931 A1 * | 4/2008 | Bando | H01L 24/48 257/99 |
| 2008/0111470 A1 | 5/2008 | Yuan | |
| 2008/0121921 A1 * | 5/2008 | Loh | H01L 33/642 257/99 |
| 2008/0170396 A1 * | 7/2008 | Yuan et al. | 362/244 |
| 2008/0237613 A1 * | 10/2008 | Lee et al. | 257/88 |
| 2008/0285270 A1 | 11/2008 | Chiang | |
| 2009/0001490 A1 * | 1/2009 | Bogner et al. | 257/432 |
| 2009/0002988 A1 * | 1/2009 | Kim et al. | 362/247 |
| 2009/0046456 A1 * | 2/2009 | Urano et al. | 362/235 |
| 2009/0059565 A1 * | 3/2009 | Bertram | 362/97.2 |
| 2009/0091947 A1 * | 4/2009 | Chou | G02F 1/133603 362/612 |
| 2009/0230413 A1 * | 9/2009 | Kobayakawa | H01L 33/483 257/91 |
| 2009/0244871 A1 * | 10/2009 | Lin | 361/791 |
| 2009/0244894 A1 * | 10/2009 | Zhou et al. | 362/249.02 |
| 2009/0289374 A1 * | 11/2009 | Aoki | H01L 25/0753 257/773 |
| 2010/0001294 A1 * | 1/2010 | Faller et al. | 257/79 |
| 2010/0103660 A1 * | 4/2010 | van de Ven et al. | 362/231 |
| 2010/0117099 A1 * | 5/2010 | Leung | H01L 25/0753 257/88 |
| 2010/0133554 A1 * | 6/2010 | Hussell | 257/88 |
| 2010/0155748 A1 * | 6/2010 | Chan et al. | 257/89 |
| 2010/0224890 A1 * | 9/2010 | Keller | H01L 33/44 257/93 |

FOREIGN PATENT DOCUMENTS

| | | | | |
|---|---|---|---|---|
| DE | WO 2008125672 A1 * | 10/2008 | | B60Q 3/008 |
| DE | WO 2009071313 A2 * | 6/2009 | | H01L 25/0753 |
| JP | 2007519221 A | 7/2007 | | |
| JP | 2008270609 A | 11/2008 | | |

(56) References Cited

FOREIGN PATENT DOCUMENTS

| WO | 2008010130 A2 | 1/2008 | |
|---|---|---|---|
| WO | WO 2008023893 A1 * | 2/2008 | 349/58 |
| WO | 2008070981 A1 | 6/2008 | |

OTHER PUBLICATIONS

Hessling, Color-variable LED light, Oct. 23, 2008, WO2008125672, English.*

* cited by examiner

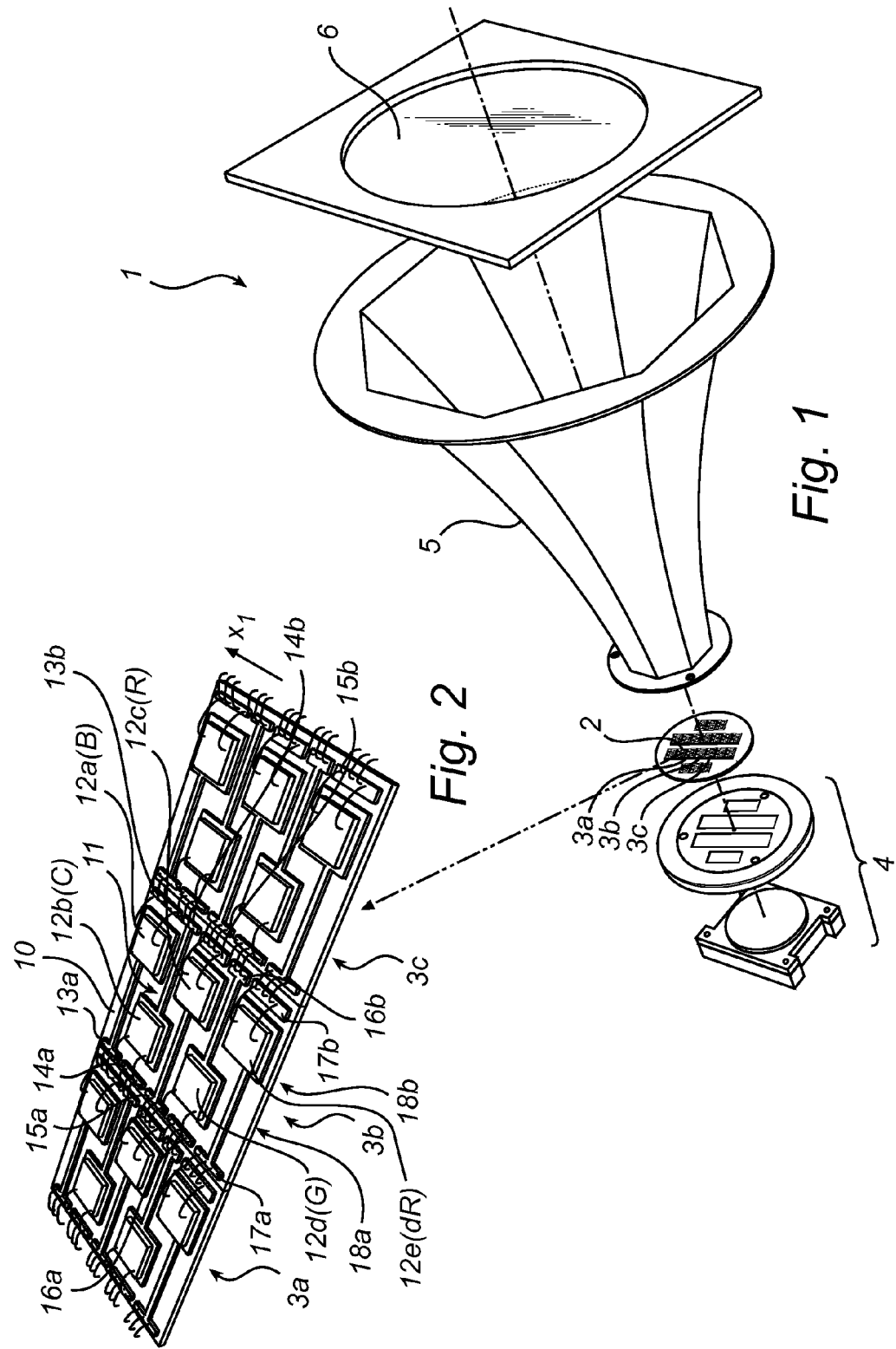

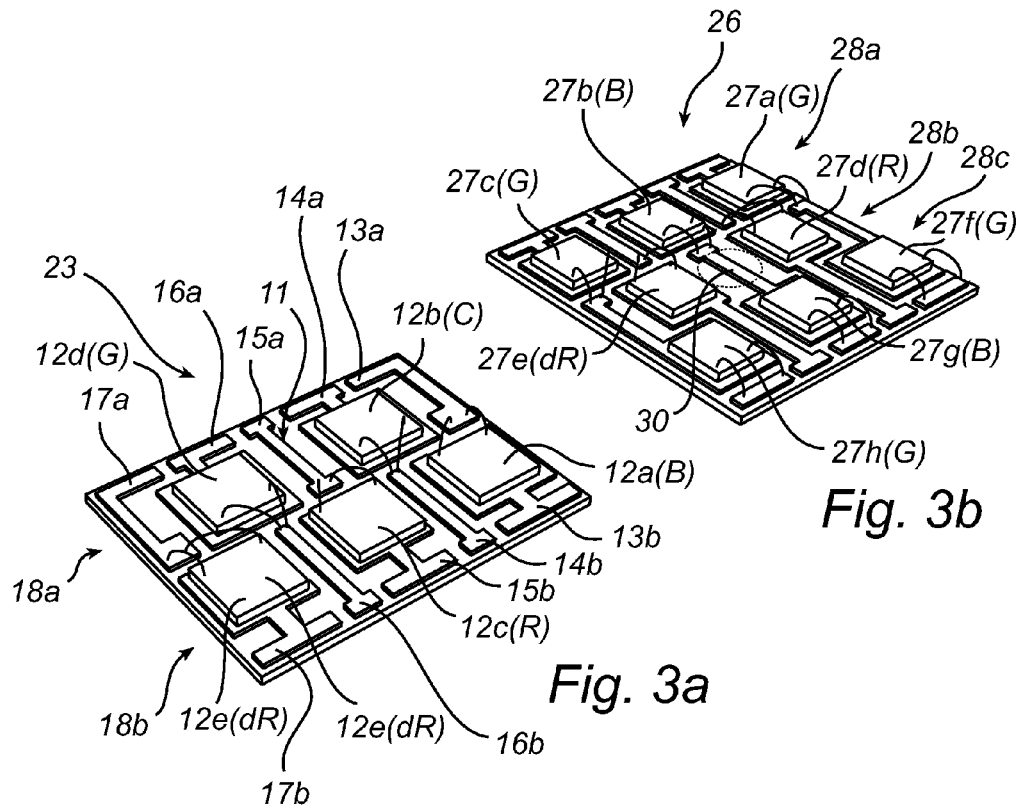
Fig. 3a
Fig. 3b
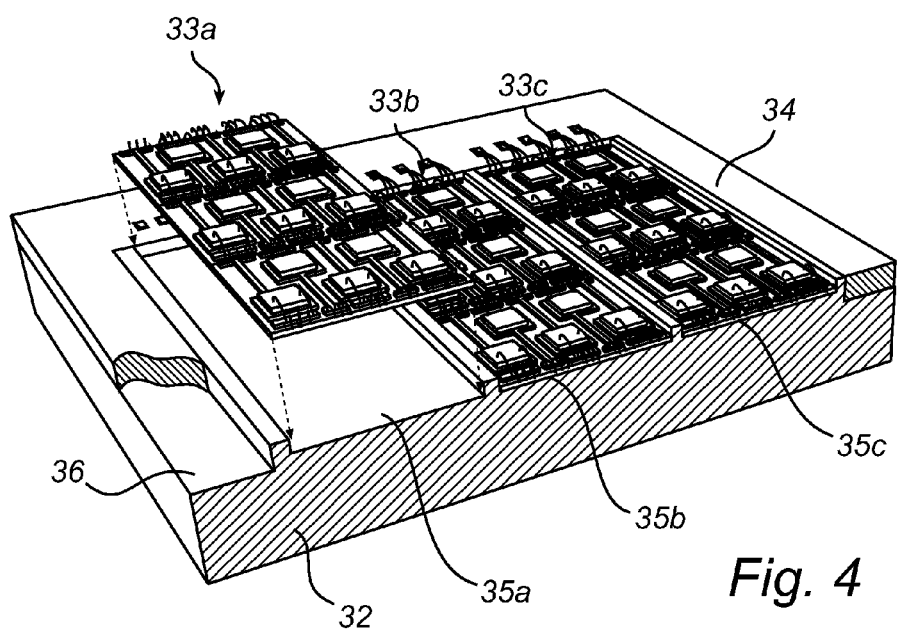
Fig. 4

LIGHT-SOURCE MODULE AND LIGHT-EMITTING DEVICE

TECHNICAL FIELD

The present invention relates to a light-emitting module and to a light-emitting device comprising a plurality of such light-emitting modules.

BACKGROUND OF THE INVENTION

With the current advances in the field of small and compact solid state light-sources, such as light-emitting diodes (LEDs) or solid state lasers, various light-output applications can be realized using a relatively large number of small light-sources including sets of individually controllable light-sources. Such applications include various illumination applications, such as, for example, systems for spot illumination, backlights for liquid crystal panels and the like.

According to one approach, a large number of light-sources may be arranged on a single carrier. However, due to the inherently low yield and poor scalability of such solutions, various modular concepts have been presented.

U.S. Pat. No. 7,350,937 discloses a lighting module for use in an LCD-backlight, which is compact and has a high packing density. However, there appears to be room for improvement with respect to the dissipation of heat generated by the LEDs comprised in the lighting module according to U.S. Pat. No. 7,350,937.

SUMMARY OF THE INVENTION

In view of the above, a general object of the present invention is to provide an improved light-emitting module.

According to the invention, there is provided a light-emitting module comprising: a plurality of light-sources arranged in at least a first and a second column arranged side by side and extending along a first direction of extension of the light-emitting module; and a plurality of connector terminal pairs, each being electrically connected to a corresponding one of the light-sources for enabling supply of electrical power thereto, each connector terminal pair comprising a first connector terminal and a second connector terminal being arranged at opposite sides of the light-emitting module, wherein the light-sources are arranged in a predetermined light-source sequence along the first direction of extension of the light-emitting module, and wherein the connector terminal pairs being electrically connected to the corresponding light-sources are arranged in the predetermined light-source sequence along the first direction of extension of the light-emitting module.

It should be understood that a "column", as the term is used in the present application, relates to an in-line arrangement of elements, in particular light-sources, regardless of orientation of the in-line arrangement. "In line" in this context means that all the light-sources are arranged substantially along a straight line, with minor deviations from the straight line, such as with a shift smaller than the lateral dimension of one light source with respect to the straight line. In practice, however, an even smaller deviation from the straight line may be advantageous, such as smaller than one half of the lateral dimension of one light-source.

The present invention is based on the realization that a light-emitting module for scalable light-emitting systems, having a high packing density and high reliability can be provided for by arranging the light-sources comprised in the light-emitting module in at least columns, that are at least partly offset relative each other in such a way that the light-sources are ordered in a given sequence, and arranging the connector terminals for connection of the light-sources to electrical power in the same sequence.

Hereby, a substantially higher packing density can be achieved than by arranging the light-sources in a single column. For example, the light-sources may advantageously be arranged on the light emitting module such that the EPI over footprint ratio is higher than 15%, preferably more than 20% and most preferably >25%. The EPI over footprint ratio is the ratio between the luminous area and the total area of the light-emitting module. Through the configuration of the light-sources and the connector terminal pairs in the light-emitting module according to various embodiments of the present invention, the dissipation of heat generated by the light-sources can be made so efficient that an increase in the EPI over footprint ratio results in a corresponding increase in brightness of the light-emitting module. This is not the case for prior art light-emitting modules having an insufficient dissipation of the heat generated by the light-sources.

Furthermore, connection side-by-side of several identical light-emitting modules is facilitated, because no crossing connections are required. Accordingly, no connector elements for handling crossing connections are necessary, which allows for an increased ratio between luminous area and total area of several interconnected light-emitting modules, and a reduced cost as compared to light-emitting modules requiring crossing connection between adjacent light-emitting modules.

Moreover, since the light-sources are arranged in sequence, the connections between the light-sources and connector terminals can be achieved by means of a substrate provided with a single conductive layer for interconnecting the light-sources and the connector terminals. This allows for the use of high-performance heat-conductive circuit boards, such as circuit boards formed by ceramic substrates having a conductor pattern provided thereon through a surface application process, such as printing or thin film techniques.

According to various embodiments of the present invention, the light-sources comprised in the light-emitting module may be individually controllable. This means that each light-source has its own connector terminal pair through which it can be individually powered. The light-emitting module may further include additional light-sources connected to one or several other light-sources, which are thus controllable as a group.

The individually controllable light-sources may advantageously be configured to emit light of mutually different primary colors, which enables color controllable output of light using the light-emitting module or a plurality of light-emitting modules that are electrically connected to each other.

According to various embodiments of the present invention, the light-emitting module may comprise a substrate having a conductor pattern formed thereon, the conductor pattern being configured to interconnect each of the light-sources with at least one of the first connector terminal and the second connector terminal of the connector terminal pair corresponding to the light-source.

Advantageously, a portion of the conductor pattern may be configured to interconnect each light-source with the substrate to form a good thermal and mechanical interface between the light-sources and the substrate. In a preferred embodiment the portion of the conductor pattern interconnecting a particular light-source with the substrate may have substantially the same shape and size as the light source.

The interconnection may be achieved using a solder connection, preferably comprising Au and Sn, preferably in a ratio of about 80% Au and 20% Sn or comprising Sn, Au and Cu.

Furthermore, a portion of the conductor pattern interconnecting one of the light-sources arranged in the first column with the first or second connector terminal may pass between two mutually adjacent light-sources arranged in the second column.

Moreover, the connector terminal pairs may be arranged to provide for spatially alternating connection of the corresponding light-sources to positive and negative voltages along the first direction of extension of the light-emitting module on each of the opposite sides of the light-emitting module.

This arrangement of the connector terminal pairs provides for arranging all interconnections between the top side of the light-sources and the connector pattern facing away from the edges of the light-emitting module, which allows for electrical connections from the top side of the light-sources, which is often provided in the form of sensitive bond wires, to be protected, using for example glob top, while still allowing functional testing of the finished light-emitting module.

Alternatively, this arrangement of the connector terminal pairs provides for arranging all interconnections between the top side of the light-sources and the connector pattern facing the edges of the light-emitting module, which facilitates mounting of the finished light-emitting modules using, for example, pick-and-place equipment. In this case, the light-emitting modules can be picked up without damaging the connections from the top side of the light-sources, which is often provided in the form of sensitive bond wires.

According to various embodiments, the light-sources comprised in the light-emitting module may advantageously be arranged in such a way that there is an unpopulated portion surrounded by light-sources for facilitating automated mounting of the light-emitting module. Such automated mounting may, for example, take place using suitable pick-and-place equipment. According to an embodiment said unpopulated portion is located substantially at the center of mass of the module, which has the advantage that the forces are balanced during pick up. Hereby, a more robust and reliable process can be achieved.

To provide sufficient space for a tool for performing the above-mentioned automated mounting, the unpopulated portion may have an area with a diameter of at least 0.7 mm, preferably with a diameter of at least 0.9 mm. According to an embodiment said unpopulated portion may have an area corresponding at least to an area occupied by one of the light-sources comprised in the light-emitting module.

To provide for the desired high ratio between luminous area and total area of the light-emitting module, the light-emitting module may advantageously comprise at least five light-sources. The at least five light-sources may be arranged in at least two columns.

According to another embodiment said light emitting module may comprise at least 8 light-sources, which may be arranged in at least 3 columns.

The light-sources may advantageously, furthermore, be solid state light sources, such as light-emitting diodes (LEDs) or solid state lasers whereby a very compact and energy efficient light-emitting module can be achieved.

For example the light-emitting module may comprise one or several light-sources from the group of light-sources comprising direct emitters, such as LEDs based on InGaN and/or AlInGaP diodes, and so-called flip chip LEDs, preferably thin film flip chip LEDs.

Moreover, the light-emitting module may comprise bond wires that electrically connect at least one of the electrodes of each light source with a suitable portion of the conductor pattern. Advantageously at least a few of the bond wires may be directly attached to at least one of the connector terminal.

Moreover, the light-emitting module may advantageously have greater extension in the first direction of extension than in a second direction of extension being perpendicular to the first direction of extension. This elongated form factor further contributes to a high ratio between luminous area and total area. Furthermore, the elongated form factor facilitates electrical connection between the light-source and the connector terminals with a minimum number of conductive layers, which, as has been discussed above, allows for improved management of the heat generated by the light-sources.

According to one exemplary configuration, the light-emitting module may be substantially rectangular with the connector terminals being arranged along the long edges of the light-emitting module. According to another embodiment the light emitting module may be substantially of parallelogram shape.

According to yet another embodiment, the light-emitting module may be provided with electrical vias going through the substrate from the conductor pattern on the top side of the substrate to another conductor pattern on the bottom of the substrate. The conductor pattern on the bottom side of the substrate may advantageously comprise the above-mentioned connector terminal pairs, whereby a bottom contact light-emitting module can be achieved. Additionally, the conductor pattern on the bottom side (the side facing away from the light-sources) of the substrate may advantageously comprise at least one so-called thermal pad provided substantially opposite the light-sources to provide for a good thermal connection between the light-sources and a heat dissipating structure to which the thermal pad(s) may be connected through an interconnection with a high thermal conductivity, such as solder.

Additionally, a plurality of light-emitting modules according to various embodiments of the present invention may be comprised in a light-emitting device. The light-emitting modules may advantageously be arranged side-by-side in a tiled configuration and be electrically connected to each other via the connector terminal pairs whereby strings of electrically interconnected light-sources are provided. Since the connector terminal pairs are arranged in the light-source sequence, the light-emitting modules can easily be arranged side-by-side and electrically interconnected without any crossing connections. The electrical interconnection between adjacent light-emitting modules may, for example, be achieved through bond wires, ribbon bonds, soldering, mechanical contact etc.

The light-emitting modules may be arranged side-by-side along a straight line, or may be shifted somewhat relative each other depending on the requirements of the particular application.

Suitably, such a string of electrically interconnected light-sources may include 8-15 light-sources, preferably 10-12 light-sources.

The above-mentioned light-emitting device may, furthermore, comprise one or several additional light-sources, such as various types of LED-modules. One such additional light-source that may advantageously be comprised in the light-emitting device is a phosphor converted LED. According to a preferred embodiment said addition light source may advantageously comprise a die on ceramic (DoC) module.

Moreover, the light-emitting device may advantageously comprise at least two of the above-mentioned strings of electrically interconnected light-sources of the same color to provide for sufficient color mixing. This may be achieved by using light-emitting modules having suitably arranged light-sources of the same color or by using several sets of light-emitting modules arranged together. According to an embodiment the light-emitting device may advantageously comprise at least 3 of the above-mentioned strings of electrically interconnected light-sources of the same color to provide for further improved color mixing.

By forming the light-emitting device from a plurality of the light-emitting modules according to various embodiments of the present invention, a scalable light-emitting surface with a high yield and advantageous thermal management properties can be provided.

To conduct away the heat generated by the light-sources and thereby provide for in improved reliability and lifetime of the light-sources, the light-emitting device may further comprise a heat-dissipating structure arranged in thermal connection with the light-emitting modules.

According to a preferred embodiment the heat dissipating structure may be at least partly made of copper and may be directly attached to the light emitting modules by a soldering interface.

Moreover, the light emitting modules may be assembled onto a metal based IMS (insulated metal substrate) or metal core PCB comprising Cu and/or Al. In this case, the light emitting module may have a metallization layer at the bottom side thereof. This makes it easier to solder it onto said IMS. The metallization layer may, for example, comprise Au (often also Ti). Moreover, the metallization layer may be patterned, preferably in such a way that at least the areas underneath the light-sources are covered for providing a good thermal contact between the light-sources and the heat-dissipating structure.

The heat-dissipating structure may advantageously be mechanically structured to define the positions of the light-emitting modules relative each other. To this end, the heat-dissipating structure may for example be provided with recesses to accommodate the light-emitting modules and/or recesses to accommodate a circuit board which may at least partly surround the light-emitting modules for providing for connection of external power to the light-emitting modules. Alternatively, the heat-dissipating structure may be provided with projections having a lateral extensions and shapes corresponding to the light-emitting modules/devices. When attaching light-emitting modules/devices to these projections using reflow soldering or a suitable liquid adhesive, the light-emitting modules/devices are aligned to the projections through capillary action, which allows for very precise positioning of the light-emitting modules/device.

Moreover, the above-mentioned light-emitting device may be comprised in an illumination device, further comprising a tubular reflector arranged to receive light emitted by the light-source comprised in the light-emitting modules.

BRIEF DESCRIPTION OF THE DRAWINGS

These and other aspects of the present invention will now be described in more detail, with reference to the appended drawings showing an exemplary embodiment of the invention, wherein:

FIG. 1 is an exploded view of an illumination system according to an embodiment of the present invention;

FIG. 2 is a perspective view of three light-emitting modules according to an embodiment of the present invention being interconnected in a tiled configuration;

FIGS. 3a-b schematically illustrate two further embodiments of the light-emitting module according to the present invention; and FIG. 4 schematically illustrates positioning of the light-emitting modules using a structured heat-dissipating structure.

DETAILED DESCRIPTION OF AN EMBODIMENT OF THE INVENTION

In the following description, the present invention is described with reference to an illumination system comprising light-emitting devices formed by a plurality of light-emitting modules being arranged side-by-side and electrically interconnected using bond wires that interconnect connector terminals in the form of bond pads located on the top side of the light-emitting modules.

It should be noted that this by no means limits the scope of the invention, which is equally applicable to many other light-emitting module configurations and interconnections between light-emitting modules comprised in a light-emitting device. For example, the connector terminals may be provided on the sides of the light-emitting modules or on the bottom side of the light-emitting modules. In particular in the case when the connector terminals are located on the sides of the light-emitting modules, the electrical interconnection between adjacent light-emitting modules may be achieved by forming solder bridges. Such solder bridges may be formed simultaneously with attaching the light-emitting modules to their carrier, which may be a heat-dissipating structure.

FIG. 1 is an exploded view schematically illustrating an illumination device for spot illumination suitable for atmosphere creating lighting, such as scene setting. The illumination device 1 comprises a light-emitting device 2 comprising a plurality of light-emitting modules 3a-c (only a few of the light-emitting modules have been assigned reference numerals for the sake of clarity of drawing), a heat-dissipating structure 4, a tubular reflector 5 and a diffuser 6.

The light-emitting device 2 is a scalable system formed by a plurality of light-emitting modules 3a-c arranged side-by-side and interconnected with non-crossing electrical connections along the sides thereof. Through this configuration, a light-emitting device having a high production yield in combination with a high ratio between luminous area and total area can be achieved.

These and further advantageous properties of the light-emitting device are provided through the light-emitting module 3a-c according to various embodiments of the present invention.

Turning to FIG. 2, the light-emitting modules 3a-c in FIG. 1 are shown in more detail (only the center light-emitting module 3b will be discussed in detail below for the sake of clarity). In the exemplary embodiment that is schematically illustrated in FIG. 2, the light-emitting module 3b comprises a substrate 10, a conductor pattern 11 formed on the substrate 10 and five individually controllable LEDs 12a-e attached to the substrate 10 and electrically connected to the conductor pattern 11. The LEDs 12a-e are configured to emit light of the mutually different primary colors blue (B) (12a), cyan (C) (12b), red (R) (12c), green (G) (12d), and deep red (dR) (12e), and the conductor pattern 11 defines corresponding connector terminal pairs 13a-b, 14a-b, 15a-b, 16a-b and 17a-b. As can be seen in FIG. 2, the LEDs 12a-e are arranged in two columns 18a-b arranged side-by-side and extending along a first direction $x_1$ of extension of the light-emitting module 3b. The columns 18a-b are offset relative each other in such a way that the LEDs 12a-e are arranged in the light-source sequence 12a/B, 12b/C, 12c/R, 12d/G, and 12e/dR along the first direction $x_1$ of extension of the light-emitting module, and the corresponding connector terminal pairs 13a-b, 14a-b, 15a-b, 16a-b and 17a-b are arranged in the same sequence.

As can be understood by studying FIG. 2, this arrangement in two columns 18a-b and in sequence of the LEDs 12a-e, and configuration of the conductor pattern 11 to define connector terminal pairs 13a-b, 14a-b, 15a-b, 16a-b and 17a-b in the same sequence results in light-emitting modules 3a-c that are easy to arrange side-by-side and electrically interconnect without crossing connecting conductors. Furthermore, the routing of the conductor pattern 11 is simplified and allows for a high ratio between luminous area and total area for the light-emitting modules 3a-c. Moreover, the connections between the LEDs 12a-e and the connector terminal pairs 13a-b, 14a-b, 15a-b, 16a-b and 17a-b can be achieved using a single conductive pattern arranged on the substrate, which allows for very efficient conduction of heat away from the LEDs 12a-e through the substrate 10 towards the heat-dissipating structure 4 (FIG. 1).

In the presently illustrated example, the substrate is a ceramic substrate and the LEDs are provided as naked dies. Furthermore, the LEDs 11a-e are electrically connected to the conductor pattern 11 through a bottom connector (not visible in FIG. 2) and bond wires, and the light-emitting modules 3a-c are electrically interconnected using bond wires.

It should, however, be noted that the substrate may be any other suitable substrate, such as a substrate made of AlN, AlOx or Si, and that one or several of the LEDs may be packaged.

FIGS. 3a-b schematically illustrate two further embodiments of the light-emitting module according to the present invention.

Turning first to FIG. 3a, the exemplary light-emitting module 23 that is schematically illustrated therein differs from the light-emitting module 3b shown in FIG. 2 in that the LEDs 12a-e have been arranged with their top side connections facing away from the sides of the light-emitting module 23, and in that the conductor pattern 11 has been modified accordingly. Hereby, the bond wire connections are distanced from the connector terminals 13a-b, 14a-b, 15a-b, 16a-b and 17a-b, which facilitates protection of the bond wires using glob top or similar (not shown in FIG. 3a) while still allowing testing of the light-emitting module 23 through probing of the connector terminals 13a-b, 14a-b, 15a-b, 16a-b and 17a-b after as well as before the application of glob-top.

FIG. 3b schematically illustrates another exemplary light-emitting module 26 on which eight LEDs 27a-h are arranged in three columns 28a-c. The LEDs 27a-h are provided in individually controllable sets of LEDs configured to emit light of mutually different primary colors. As is indicated in FIG. 3b, four of the LEDs 27a, 27c, 27f, and 27h are configured to emit green (G) light, two of the LEDs 27b and 27g are configured to emit blue (B) light, one of the LEDs 27d is configured to emit red (R) light and one of the LEDs 27e is configured to emit deep red (dR) light.

As can be seen in FIG. 3b, some of the LEDs that are configured to emit light having the same color are connected to each other and together form an individually controllable set of light-sources. The individually controllable sets of light-sources in the embodiment in FIG. 3b are green (G) LEDs 27a and 27f, red (R) LED 27d, blue (B) LEDs 27b and 27g, deep red (dR) LED 27e and green (G) LEDs 27c and 27h.

Furthermore, the LEDs 27a-h in the exemplary light-emitting module 26 in FIG. 3b are arranged in such a way that there is an unpopulated portion 30 surrounded by LEDs 27a-h for facilitating mounting of the light-emitting module 26. In particular, a pick-and-place tool can pick up the light-emitting module 26 at the unpopulated portion 30.

For optimum quality of the light output by the illumination device 1 in FIG. 1 in respect of such factors as color mixing and uniformity, the light-emitting device(s) 2 comprised therein should be positioned accurately at least in relation to each other and advantageously also in relation to the tubular reflector 5.

FIG. 4 schematically illustrates a light-emitting device according to an embodiment of the present invention, comprising a heat-dissipating structure 32 that is structured so as to define the positions of the light-emitting devices 33a-c, each comprising a plurality of interconnected light-emitting modules, in relation to each other and to the printed circuit board (PCB) 34 used for connecting the light-emitting device 33a-c to external power.

As is schematically indicated in FIG. 4, the heat-dissipating structure 32 is provided with a number of relatively shallow recesses 35a-c for accommodating the light-emitting devices 32a-c and a relatively deep recess 36 for accommodating the PCB 34, which, in the exemplary embodiment that is shown in FIG. 4, is considerably thicker than the light-emitting devices 32a-c. By fitting the light-emitting devices 32a-c and the PCB 34 in the respective recesses 35a-c, 36, the light-sources comprised in the light-emitting devices 32a-c can be positioned accurately and reliably in relation to each other and to the PCB 34.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The invention claimed is:
1. A light-emitting module, comprising:
a substrate having a top and a bottom, and further having a first side extending in a first direction from a first end of the substrate to a second end of the substrate, and a second side opposite the first side also extending in the first direction from the first end of the substrate to the second end of the substrate;
a plurality of light-sources arranged on the top of the substrate, including a plurality of first light-sources aligned with each other in a first column and a plurality of second light-sources aligned with each other in a second column, each of which columns extends along the first direction, wherein the first and second columns are side by side, separated and spaced apart from each other in a second direction which is orthogonal to the first direction, the second direction extending from the first side of the substrate to the second side of the substrate;

a plurality of connector terminal pairs, each being electrically connected to a corresponding one of said plurality of light-sources for enabling supply of electrical power thereto, each connector terminal pair comprising a first connector terminal disposed immediately adjacent to the first side of the substrate and a second connector terminal disposed immediately adjacent to the second side of the substrate; and at least one bond wire, the bond wire connecting at least one of the light sources to one connector terminal of its corresponding connector terminal pair, wherein none of said first light-sources of the first column is aligned with any of the second light sources of the second column along the second direction, and wherein the connector terminal pairs are arranged to provide for spatially alternating connection of the corresponding light sources to positive and negative voltages along the first direction on each of the first and second sides of the substrate.

2. The light-emitting module of claim 1, wherein each of said plurality of light-sources is individually controllable.

3. The light-emitting module of claim 1, wherein said plurality of light-sources are configured to emit light of mutually different primary colors.

4. The light-emitting module of claim 1, wherein the substrate has a conductor pattern formed thereon,
the conductor pattern being configured to interconnect each of said light-sources with at least one of said first connector terminal and said second connector terminal of the connector terminal pair corresponding to the light-source.

5. The light-emitting module of claim 4, wherein a portion of said conductor pattern interconnecting one of said first light-sources arranged in said first column with said first or second connector terminal passes between two mutually adjacent second light-sources arranged in said second column.

6. The light-emitting module of claim 5, wherein the bond wire connects the one of the first light sources arranged in the first column to the first or second connector terminal which is connected to the one of the first light sources by the portion of the conductor pattern which passes between the two mutually adjacent second light-sources arranged in said second column.

7. The light-emitting module of claim 1, wherein said plurality of light-sources are arranged in such a way that there is an unpopulated portion surrounded by at least some of the light-sources for facilitating automated mounting of the light-emitting module.

8. The light-emitting module of claim 7, wherein said unpopulated portion has an area corresponding at least to one half of an area occupied by one of said plurality of light-sources.

9. The light-emitting module of claim 1, wherein a ratio between a luminous area of the light-emitting module and a total surface area of the light-emitting module is greater than 25%.

10. The light-emitting module of claim 1, wherein each of the plurality of light sources is configured to receive electric power directly from its corresponding terminal pair.

11. A device comprising a plurality of light-emitting modules, wherein each of the light-emitting modules comprises:

a plurality of light-sources arranged in at least a plurality of first light-sources aligned with each other in a first column and a plurality of second light-sources aligned with each other in a second column, each of which columns extends along a first direction of the light-emitting module, wherein the first and second columns are side by side, separated and spaced apart from each other in a second direction which is orthogonal to the first direction, wherein the second direction extends from a first side of the light-emitting module to a second side of the light-emitting module; and a plurality of connector terminal pairs, each being electrically connected to a corresponding one of said plurality of light-sources for enabling supply of electrical power thereto, each connector terminal pair comprising a first connector terminal disposed immediately adjacent to the first side of the light-emitting module and a second connector terminal disposed immediately adjacent to the second side of the light-emitting module such that the first and second connector terminals do not overlap each other, wherein the first light-sources of the first column are at least partially offset in the first direction with respect to the second light-sources of the second column, wherein the connector terminal pairs are arranged to provide for connection of the corresponding light sources to positive and negative voltages which spatially alternate with each other along the first direction on each of the first and second sides of the light-emitting module, and wherein the light-emitting modules are electrically connected to each other via said connector terminal pairs.

12. The device of claim 11, further comprising a heat-dissipating structure arranged in thermal connection with said light-emitting modules.

13. The device of claim 12, wherein said heat-dissipating structure is mechanically structured to define the positions of the light-emitting modules relative to each other.

14. The device of claim 11, further comprising:
a tubular reflector arranged to receive light emitted by the plurality of light-sources.

15. The device of claim 11, wherein each of the light-emitting modules further comprises at least one bond wire, the bond wire connecting at least one of the plurality of light sources to one connector terminal of its corresponding connector terminal pair.

16. The device of claim 11, wherein the light-emitting modules are electrically connected to each other via bond wires between the connector terminal pairs.

17. A light-emitting module, comprising:
a plurality of light-sources each having a top surface and a bottom surface, including a plurality of first light sources arranged in a first column and a plurality of second light sources arranged in a second column, each of which columns extends along a first direction of said light-emitting module;

a plurality of connector terminal pairs, each being electrically connected to a corresponding one of the plurality of light-sources and further being configured to receive a supply of electrical power directly from outside of the light-emitting module, each connector terminal pair comprising a first connector terminal and a second connector terminal being disposed at opposite sides of the light-emitting module with respect to each other; and a plurality of bond wires each connecting a top surface of a corresponding one of the plurality of light-sources to the first connector terminal of the corresponding connector terminal pair, wherein the connector terminal pairs are arranged to provide for spatially alternating connection of the corresponding light sources to positive and negative voltages along the first direction on each of the opposite sides of the light-emitting module.

18. The light-emitting module of claim 17, further comprising a substrate on which the plurality of light-sources are arranged, wherein the substrate has a conductor pattern formed thereon, the conductor pattern being configured to interconnect each of said plurality of light-sources with the second connector terminal of the connector terminal pair corresponding to the light-source without including any bond wire, wherein a portion of said conductor pattern interconnecting one of said first light-sources arranged in said first column with said connector terminal passes between two mutually adjacent second light-sources arranged in said second column.

19. The light-emitting module of claim 17, wherein none of said first light-sources of the first column is aligned with any of the second light sources of the second column along the second direction.

20. The light-emitting module of claim 17, wherein the opposite sides of the light-emitting module comprise a first side of the light-emitting module and a second side of the light-emitting module opposite the first side, and wherein the first connector terminal is disposed immediately adjacent to the first side of the light-emitting module and the second connector terminal is disposed immediately adjacent to the second side of the light-emitting module.

\* \* \* \* \*